(12) United States Patent
Huang et al.

(10) Patent No.: US 9,368,673 B2
(45) Date of Patent: Jun. 14, 2016

(54) METHOD FOR MANUFACTURING LIGHT EMITTING DIODE PACKAGE

(71) Applicant: ADVANCED OPTOELECTRONIC TECHNOLOGY, INC., Hsinchu Hsien (TW)

(72) Inventors: Chien-Shiang Huang, Hsinchu (TW); Tzu-Chien Hung, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/695,365

(22) Filed: Apr. 24, 2015

(65) Prior Publication Data

US 2016/0064595 A1    Mar. 3, 2016

(30) Foreign Application Priority Data

Sep. 2, 2014 (CN) .......................... 2014 1 0442162

(51) Int. Cl.
*H01L 33/48* (2010.01)
*H01L 33/00* (2010.01)

(52) U.S. Cl.
CPC ......... *H01L 33/005* (2013.01); *H01L 2933/005* (2013.01); *H01L 2933/0016* (2013.01); *H01L 2933/0025* (2013.01); *H01L 2933/0075* (2013.01)

(58) Field of Classification Search
CPC ............................ H01L 33/48; H01L 51/5275
See application file for complete search history.

(56) References Cited

U.S. PATENT DOCUMENTS

| | | | | |
|---|---|---|---|---|
| 2012/0273823 A1* | 11/2012 | Yoneda | ................... | H01L 33/38 257/98 |
| 2013/0001632 A1* | 1/2013 | Imai | ....................... | H01L 33/62 257/99 |

* cited by examiner

*Primary Examiner* — Mohammad Choudhry
(74) *Attorney, Agent, or Firm* — Novak Druce Connolly Bove + Quigg LLP (57) ABSTRACT

A method for manufacturing a light emitting diode (LED) package, the method includes providing an LED chip and forming electrodes on a top surface of the LED chip; forming a first electric insulation layer on the top surface of the LED chip, the first electric insulation layer adapted to enclose the electrodes therein; etching the first electric insulation layer to define a plurality of second through holes; forming a substrate on a top surface of the first electric insulation layer, the substrate adapted to fill in the plurality of second through holes, the substrate directly contacting the electrodes; dividing the substrate into a plurality of spaced heat dissipation parts; and forming a packaging layer on a bottom surface of the substrate, the packaging layer adapted to enclose the LED chip therein.

14 Claims, 14 Drawing Sheets

METHOD FOR MANUFACTURING LIGHT EMITTING DIODE PACKAGE

FIELD

The subject matter herein generally relates to a method for manufacturing a light emitting diode (LED) package with a proved heat dissipation efficiency.

BACKGROUND

A typical LED package includes an LED chip and a packaging layer enclosing the LED chip therein. When the LED chip is acted to emit, a plurality of heat generated from the LED chip is accumulated in the packaging layer.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 1:
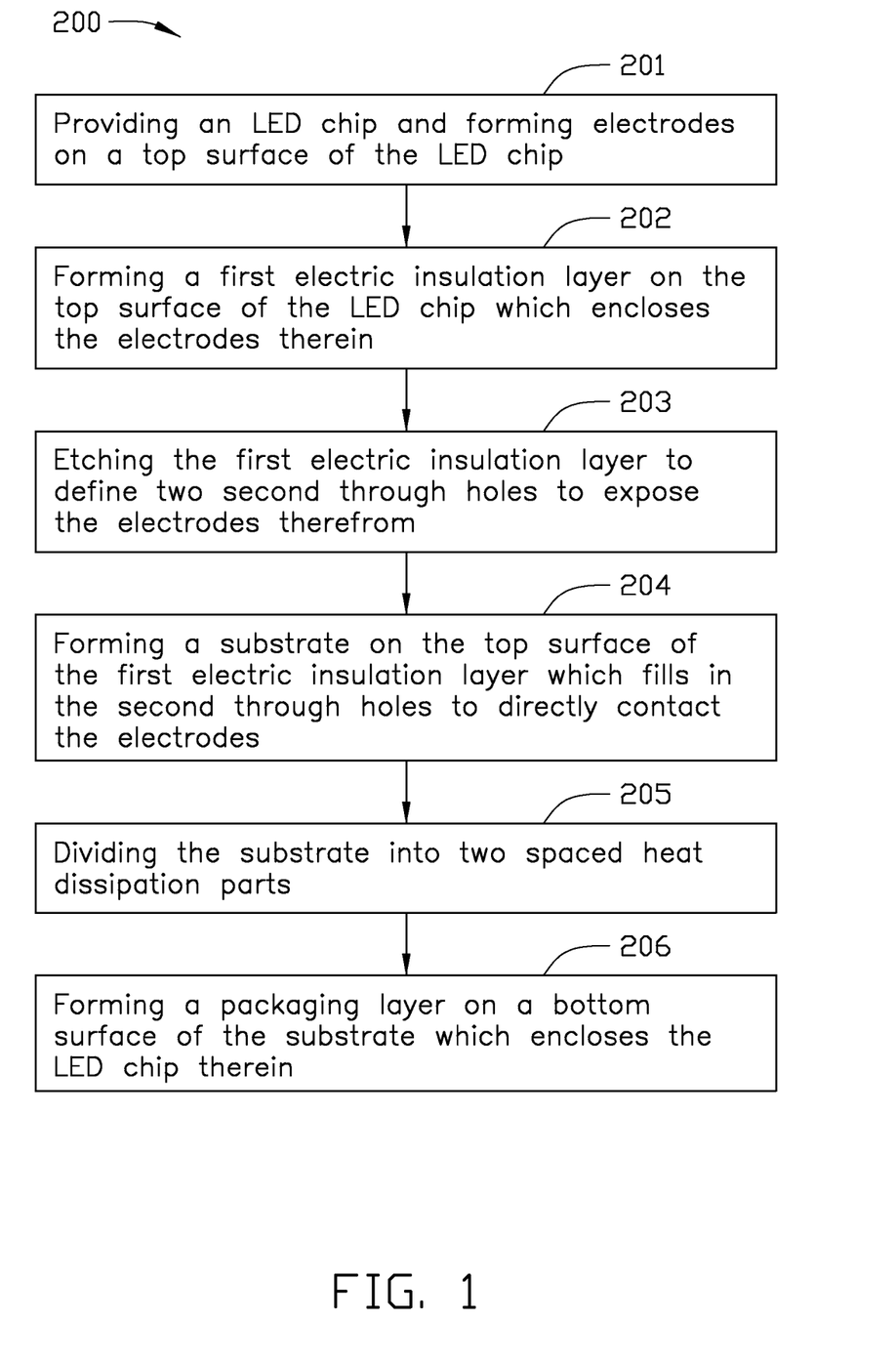
FIG. 1 is a flow chart of a method for manufacturing an LED package in accordance with an exemplary embodiment of the present disclosure.

Referring to FIG. 1, a flowchart is presented in accordance with an example embodiment which is being thus illustrated. The example method 200 is provided by way of example, as there are a variety of ways to carry out the method. The method 200 described below can be carried out using the configurations illustrated in FIGS. 2-13, for example, and various elements of these figures are referenced in explaining example method 200. Each block shown in FIG. 1 represents one or more processes, methods or subroutines, carried out in the exemplary method 200. Furthermore, the illustrated order of blocks is by example only and the order of the blocks can change according to the present disclosure. Additional blocks may be added or fewer blocks may be utilized, without departing from this disclosure. The exemplary method 200 can begin at block 201.

At block 201, provides an LED chip 10 and forms electrodes 20 on a top surface of the LED chip 10.

Figure 2:
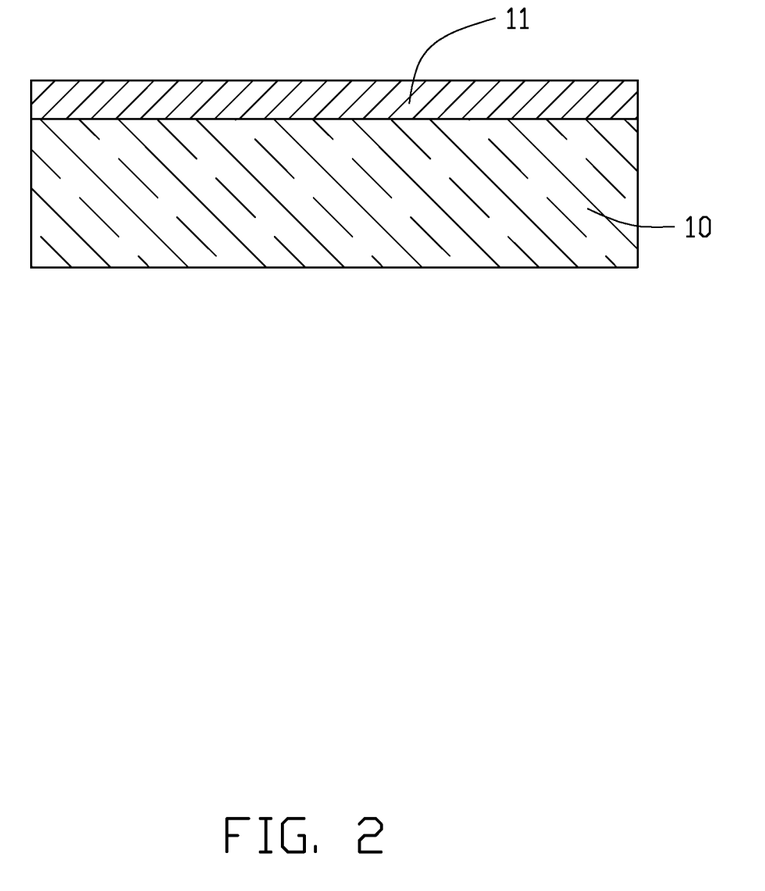
FIGS. 2-5 are diagrammatic views showing a step of forming electrodes on a top surface of an LED chip of the method for manufacturing the LED package.

Referring to FIG. 2, when the LED chip 10 is provided, a first photoresist layer 11 is formed on the top surface of the LED chip 10. In this embodiment, the LED chip 10 is an UV LED chip.

Figure 3:
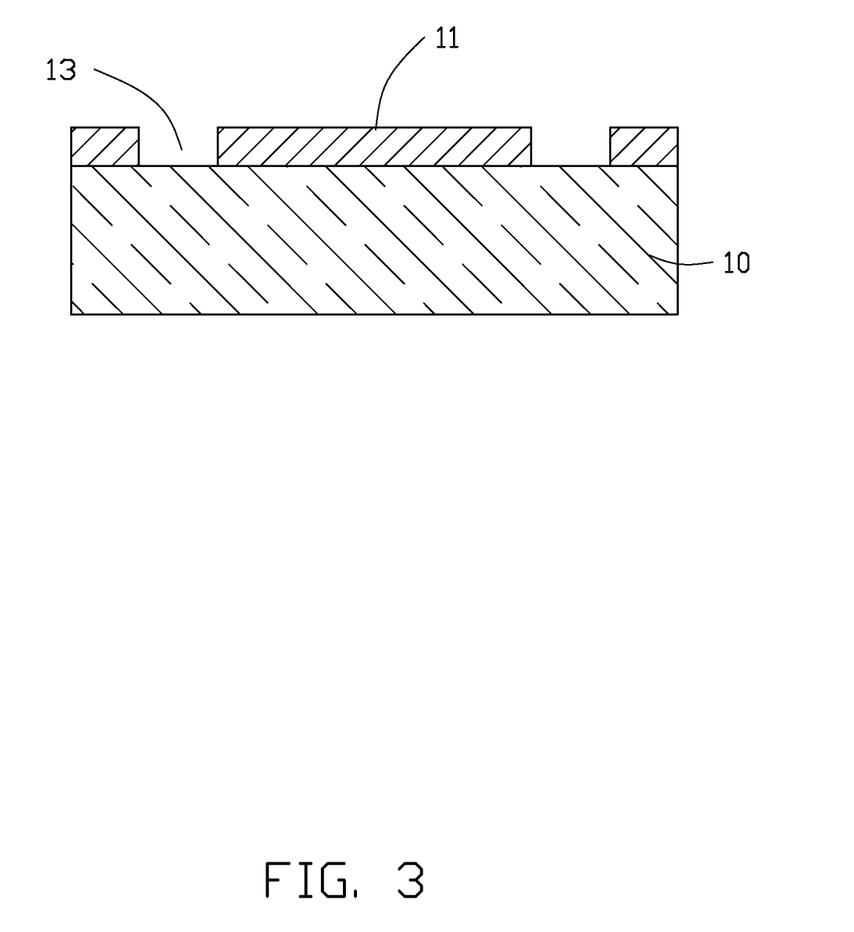

Referring to FIG. 3, opposite ends of the first photoresist layer 11 is etched by photolithography etching to define two first through holes 13 in the first photoresist layer 11. The first through holes 13 are spaced from each other and a part of the top surface of the LED chip 10 are exposed therefrom.

Figure 4:
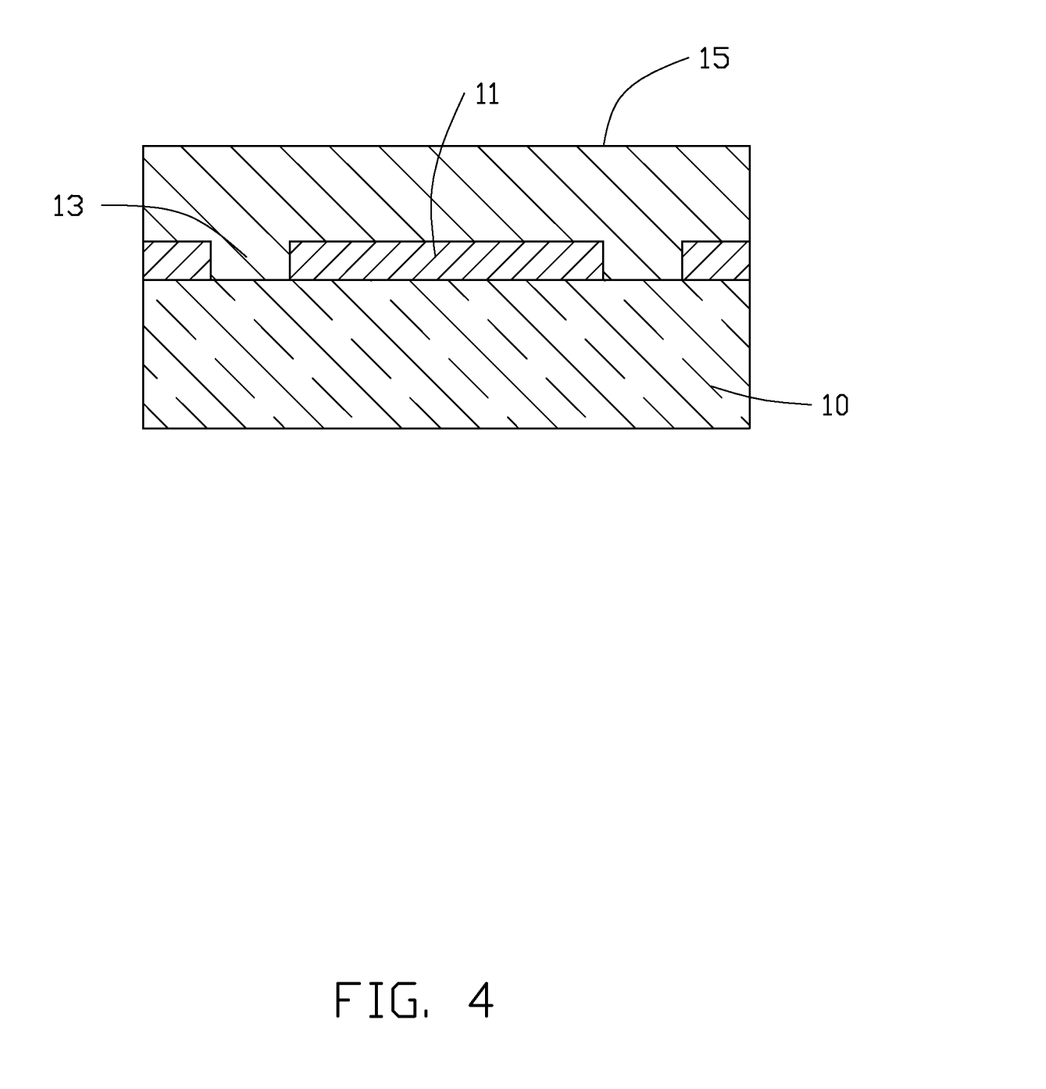

Referring to FIG. 4, a metallic film 15 is formed on a top surface of the first photoresist layer 11 and fills in the first through holes 13 by plating or sputter.

Figure 5:
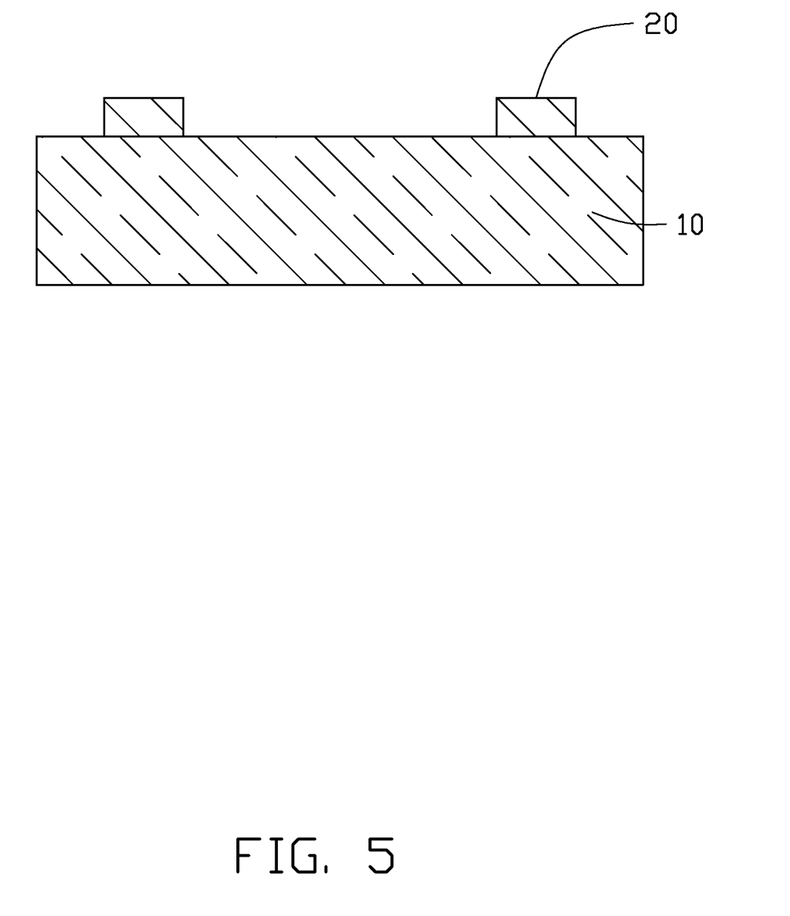

Referring to FIG. 5, the metallic film 15 and the first photoresist layer 11 are removed from the LED chip 10 by organic solvent except a part thereof filled in the first through holes 13. The remained part of metallic film 15 forms the electrodes 20. In this embodiment, a material of the electrode 20 is selected from nickel, copper, brass, bronze or an alloy thereof.

At block 202, forms a first electric insulation layer 30 on the top surface of the LED chip 10 which encloses the electrodes 20 therein.

Figure 6:
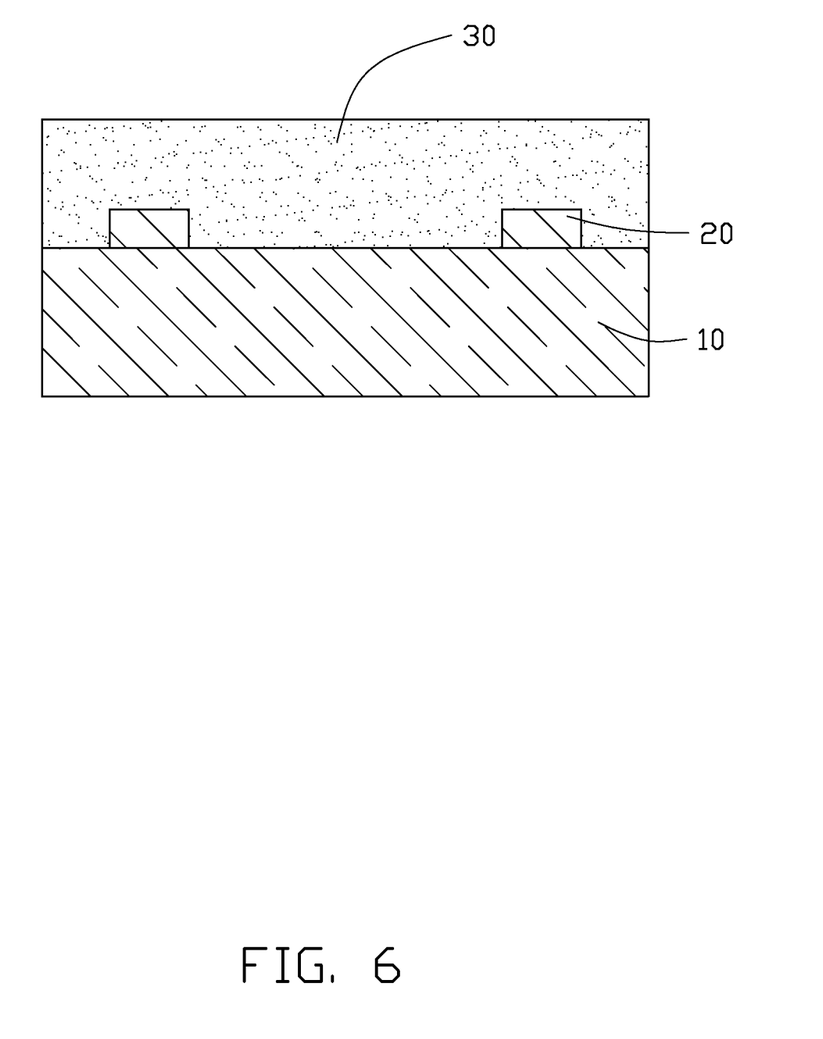
FIG. 6 is diagrammatic view showing a step of forming a first electric insulation layer on the top surface of the LED chip.

Referring to FIG. 6, in this embodiment, the first electric insulation layer 30 is formed by chemical vapor deposition. A material of the first electric insulation layer 30 is selected from silicon dioxide, silicon nitride, aluminum oxide, aluminum nitride and so on. A periphery of the first electric insulation layer 30 is coplanar with a periphery of the LED chip 10.

At block 203, etches the first electric insulation layer 30 to define two second through holes to expose the electrodes 20 therefrom.

Figure 7:
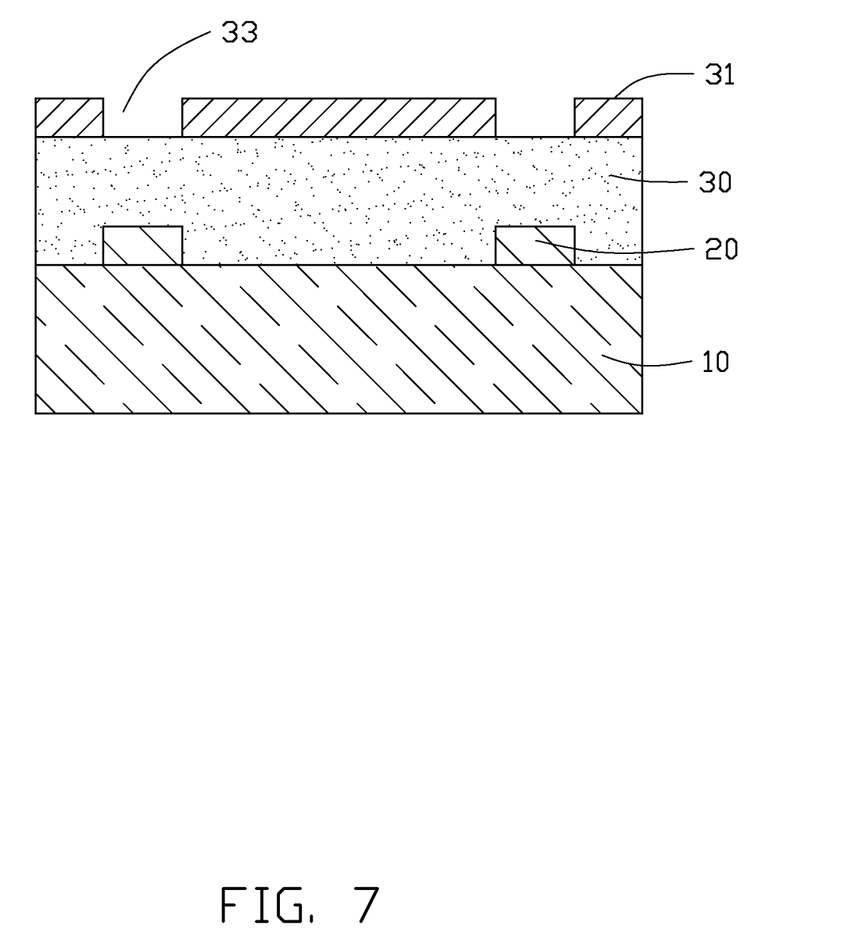
FIG. 7-8 are diagrammatic views showing a step of etching the first electric insulation layer to define two second through holes to expose the electrodes from the first electric insulation layer.
Figure 8:
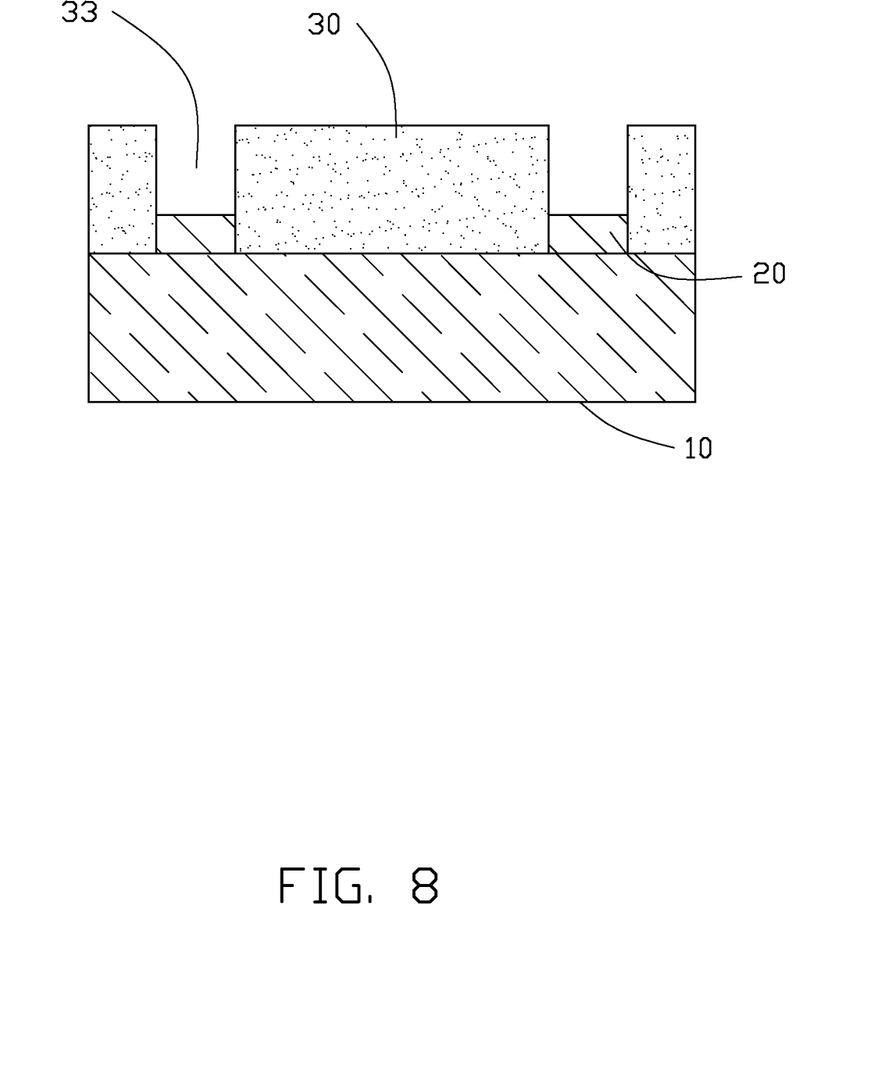

Referring to FIG. 7, to carry out the above step, a second photoresist layer 31 is formed on the top surface of the first electric insulation layer 30 and opposite ends of the second photoresist layer 31 are etched to define two through holes therein and then the first electric insulation layer 30 is etched along the through holes of the second photoresist layer 31 from top to bottom until the top surfaces of the electrodes 20 exposed. Thus, two spaced second through holes 33 are defined in the first electric insulation layer 30. Referring to FIG. 8, the second photoresist layer 31 is removed. The electrodes 20 are below the second through holes 33 and aligned with the second through holes 33. A size of a bottom end of the second through hole 33 is the same that of a top end of the electrode 20.

At block 204, forms a substrate 40 on the top surface of the first electric insulation layer 30 which fills in the second through holes 33 to directly contact the electrodes 20.

Figure 9:
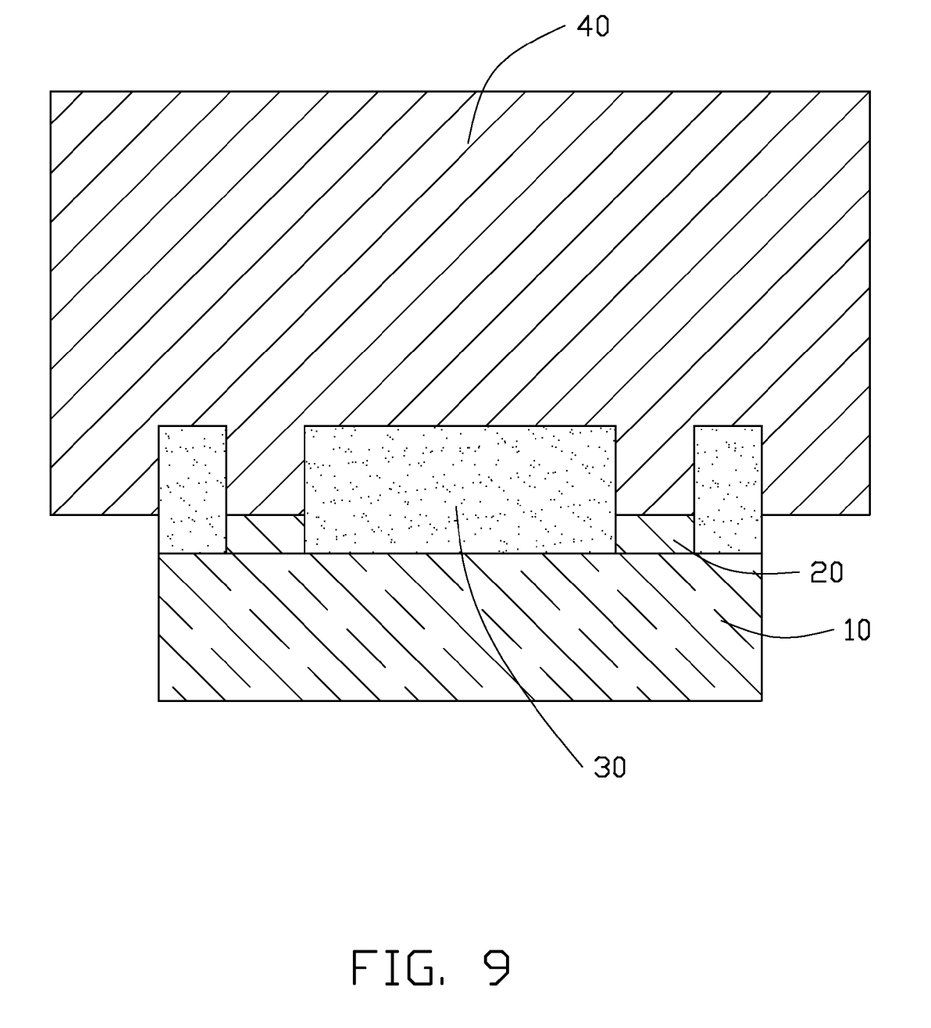
FIG. 9 is diagrammatic view showing a step of forming a substrate on the top surface of the first electric insulation layer.

Referring to FIG. 9, the substrate 40 is formed by plating. A material of the substrate 40 is selected from nickel, copper or alloy thereof. A thickness of the substrate 40 is less than 50 micron. A top end of the first electric insulation layer 30 is received in the substrate 40. A width of the substrate 40 is larger than that of the LED chip 10. The LED chip 10 is below the substrate 40 and aligned with a central portion of the substrate 40. The substrate 40 has an improved heat dissipation efficiency.

At block 205, divides the substrate 40 into two spaced heat dissipation parts 41.

Figure 10:
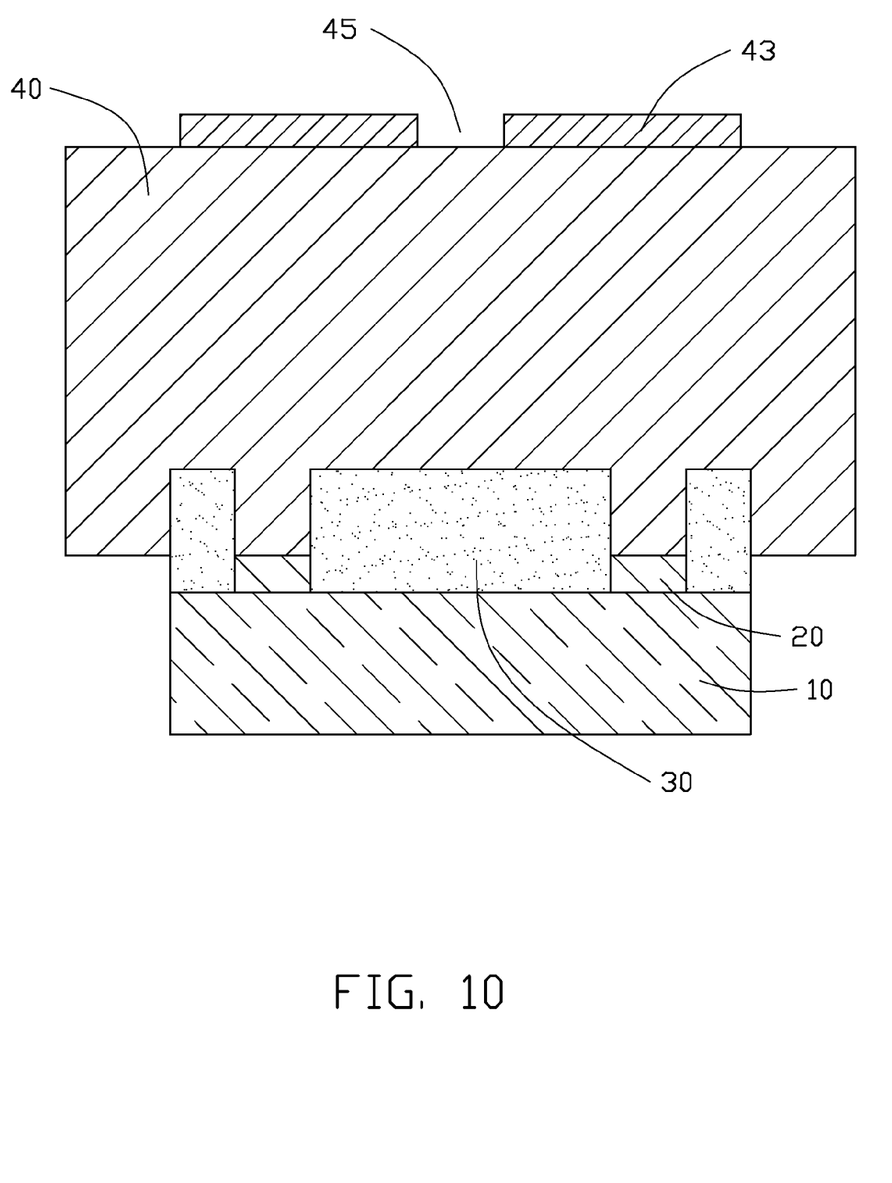
FIGS. 10-13 are diagrammatic views showing a step of dividing the substrate into two spaced heat dissipation parts.

Referring to FIG. 10, in this process, forms a third photoresist layer 43 on a top surface of the substrate 20 and etches a central portion of the third photoresist layer 43 to define a first channel 45 in the third photoresist layer 43. The first channel 45 is a through hole and a part of the top surface of the substrate 40 exposed therefrom.

Figure 11:
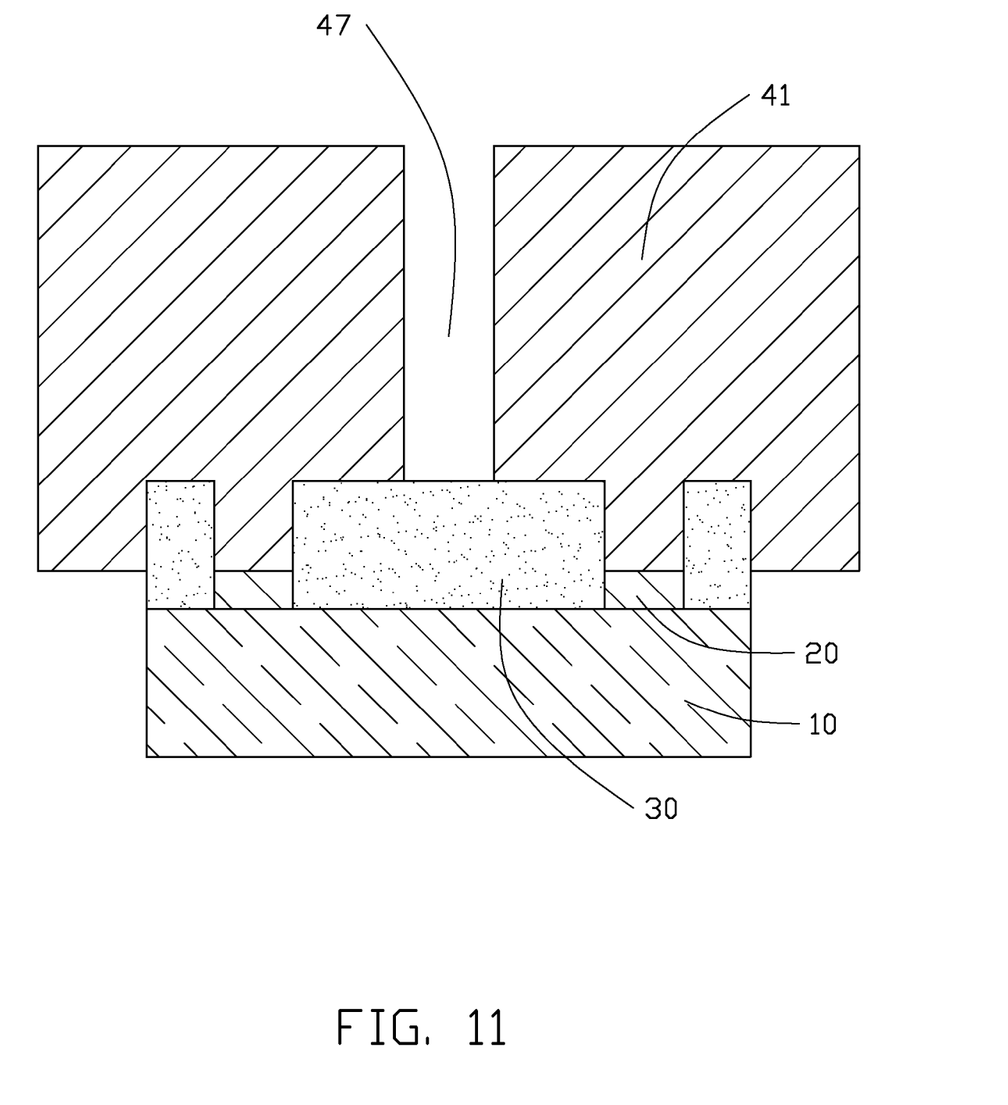

Referring to FIG. 11, the substrate 40 is etched along the first channel 45 from top to bottom until the top surface of the first electric insulation layer 30 exposed, then the third photoresist layer 43 is removed. In this state, a second channel 47 is defined in the substrate 40. The second channel 47 extends through the substrate 40 from top to bottom to divide the substrate 40 into the two spaced heat dissipation parts 41.

Figure 12:
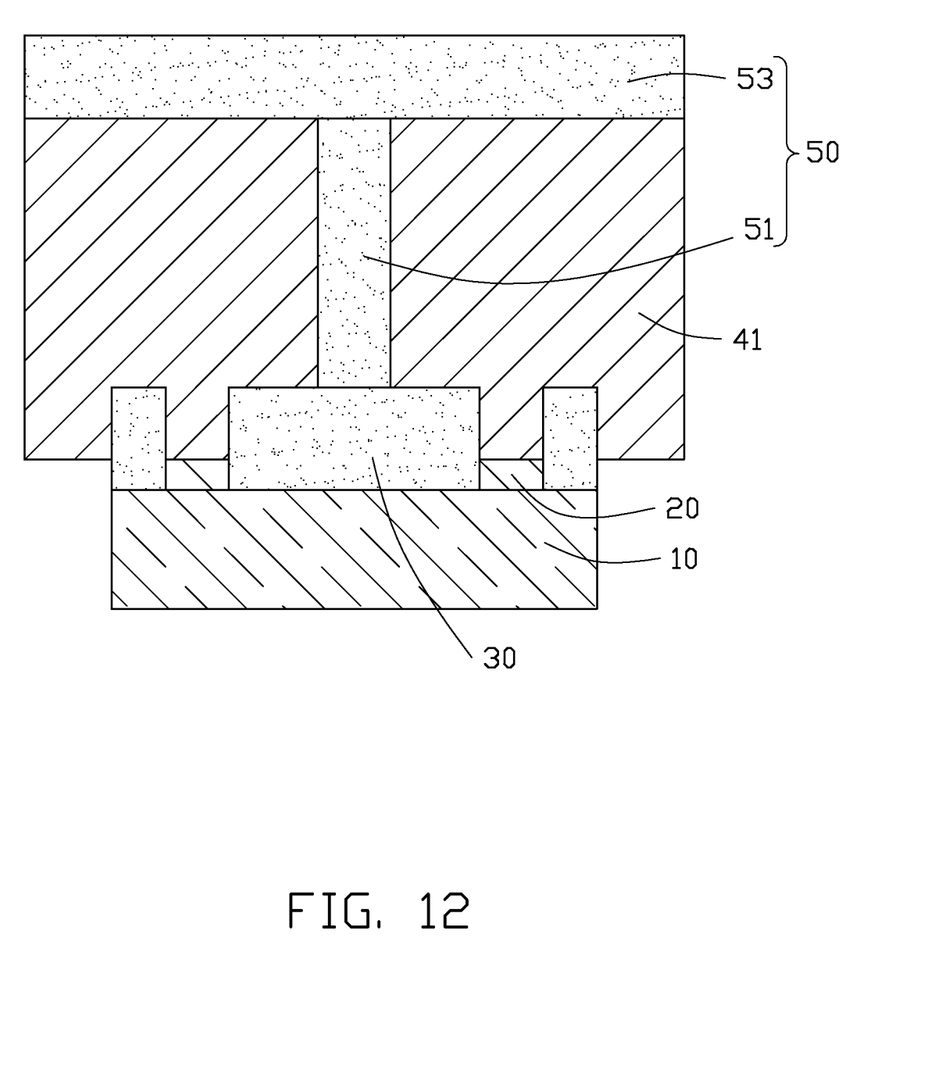
Figure 13:
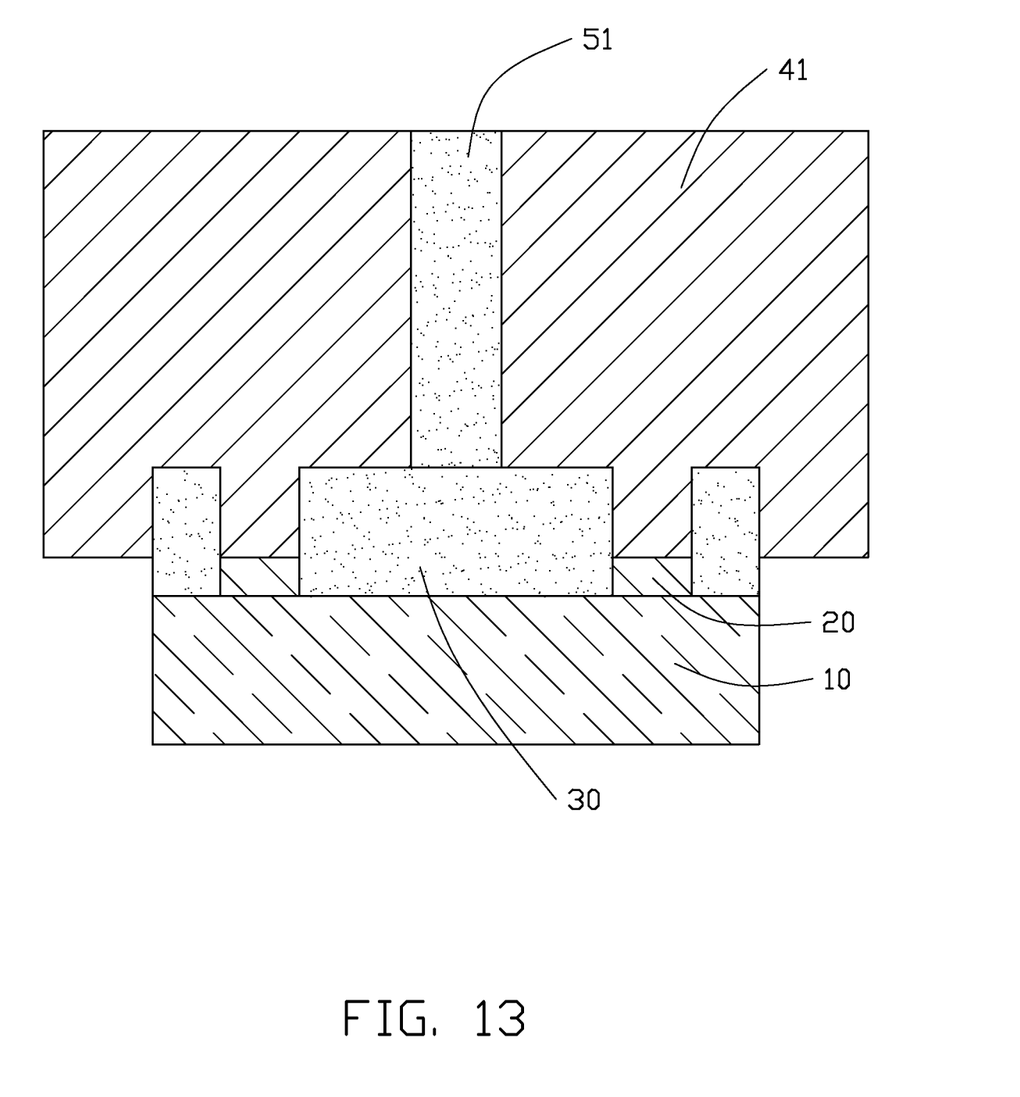

Referring to FIG. 12, a second electric insulation layer 50 is formed in the second channel 47 to ensure the two heat dissipation parts 41 electric insulating from each other. The second insulation layer 50 includes a first insulation portion 51 filling the second channel 47 and a second insulation portion 53 covering top surfaces of the heat dissipation parts 41. Referring to FIG. 13, the second insulation portion 53 then is removed to expose the top surfaces of the heat dissipation parts 41.

At block 206, forms a packaging layer 60 on a bottom surface of the substrate 40 which encloses the LED chip 10 therein.

Figure 14:
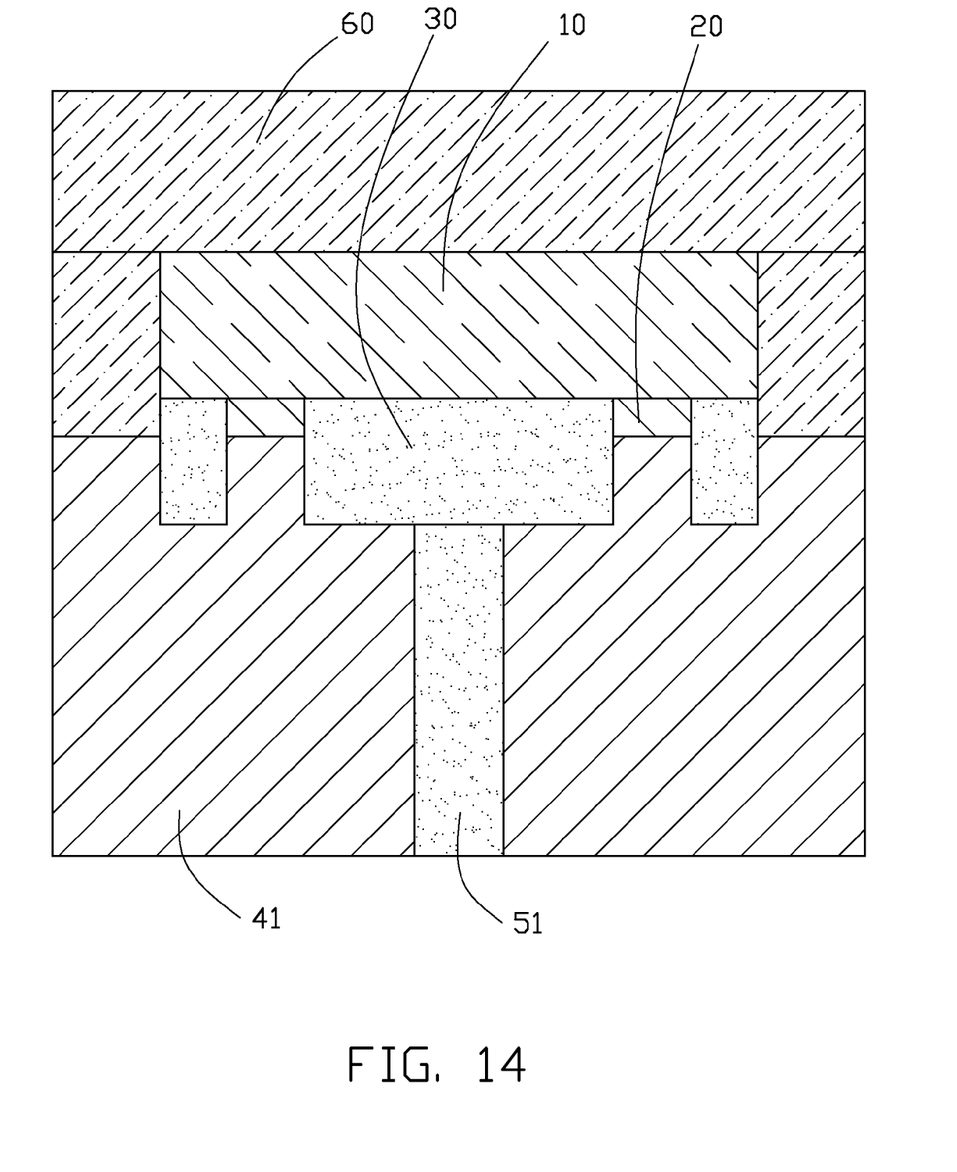
FIG. 14 is a cross-sectional view of the LED package.

Referring to FIG. 14, the packaging layer 60 is made of glue and encloses the LED chip 10 and a bottom end of the first electric insulation layer 30 therein. The glue is a pure optical encapsulant material or a mixture mixed by a pure optical encapsulant material and phosphor powder.

In this state, the LED packaging is manufactured completely. The LED package includes the LED chip 10, the first electric insulation layer 30 formed on a side of the LED chip 10, the electrodes 20 extending through the first electric insulation layer 30 and directly formed on the LED chip, the spaced heat dissipation parts 41 and the packaging layer 60.

In this disclosure, the heat dissipation parts 41 expose from the packaging layer 60 and has improved heat dissipation efficiency, heat generated from the LED chip 10 may be dissipated directly and efficiently. The thickness of the first electric insulation layer 30 is less than 20 micron and has good heat conductive efficiency. Therefore, the first electric insulation layer 30 may transmits the heat of the LED chip 10 to the heat dissipation parts 41 quickly.

The embodiments shown and described above are only examples. Many details are often found in the art such as the other features of an LED package manufacturing method. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning the terms used in the claims. It will therefore be appreciated that the embodiments described above may be modified within the scope of the claims.

What is claimed is:

1. A method for manufacturing a light emitting diode (LED) package, the method comprising:
   providing an LED chip and forming electrodes on a top surface of the LED chip;
   forming a first electric insulation layer on the top surface of the LED chip, the first electric insulation layer adapted to enclose the electrodes therein;
   etching the first electric insulation layer to define a plurality of second through holes
   forming a substrate on a top surface of the first electric insulation layer, the substrate adapted to fill in the plurality of second through holes, the substrate directly contacting the electrodes;
   dividing the substrate into a plurality of spaced heat dissipation parts; and
   forming a packaging layer on a bottom surface of the substrate, the packaging layer adapted to enclose the LED chip therein;
   wherein the step of etching the first electric insulation layer to define a plurality of second through holes is carried out by following steps:
   forming a second photoresist layer on a top surface of the first electric insulation layer;
   etching a part of the second photoresist layer and the first electric insulation layer to expose the electrodes, and two second through holes defined in the first electric insulation layer; and
   removing the second photoresist layer.

2. The method of claim 1, wherein a thickness of the substrate is less than 50 micron.

3. The method of claim 2, wherein a material of the substrate is selected from nickel, copper or alloy thereof.

4. The method of claim 1, wherein a thickness of the first electric insulation layer is less than 20 microns.

5. The method of claim 1, wherein the electrodes are formed by following steps:
   forming a first photoresist layer on the top surface of the LED chip;
   etching opposite ends of the first photoresist layer to define two first through holes in the first photoresist layer to expose a part of the top surface of the LED chip;
   forming a metallic film on a top surface of the first photoresist layer which fills in the first through holes; and
   removing the first photoresist layer and a part of the metallic film to remain the other part of the metallic film located in the first through hole to form the electrodes.

6. The method of claim 1, wherein step of dividing the substrate into a plurality of spaced heat dissipation parts is carried out by following steps:
   forming a third photoresist layer on a top surface of the substrate and etches a central portion of the third photoresist layer to define a first channel in the third photoresist layer;
   etching the substrate along the first channel from top to bottom until the top surface of the first electric insulation layer exposed; and
   removing the third photoresist layer.

7. The method of claim 6, wherein a second electric insulation layer is formed in the second channel to ensure the two heat dissipation parts electric insulating from each other.

8. The method of claim 7, wherein glue is a pure optical encapsulant material or a mixture mixed by a pure optical encapsulant material and phosphor powder.

9. The method of claim 1, wherein the packaging layer is made of glue.

10. A method for manufacturing a light emitting diode (LED) package, the method comprising:

provided an LED chip and forming electrodes on a top surface of the LED chip; forming a first electric insulation layer on the top surface of the LED chip, the first electric insulation layer adapted to enclose the electrodes therein;

etching the first electric insulation layer to define a plurality of second through holes;

forming a substrate on a top surface of the first electric insulation layer, the substrate adapted to fill in the plurality of second through holes, the substrate directly contacting the electrodes;

dividing the substrate into a plurality of spaced heat dissipation parts and forming a packaging layer on a bottom surface of the substrate, the packaging layer adapted to enclose the LED chip therein;

wherein step of dividing the substrate into a plurality of spaced heat dissipation parts is carried out by following steps:

forming a third photoresist layer on a top surface of the substrate and etches a central portion of the third photoresist layer to define a first channel in the third photoresist layer;

etching the substrate along the first channel from top to bottom until the top surface of the first electric insulation layer exposed; and removing the third photoresist layer.

11. The method of claim 10, wherein a thickness of the substrate is less than 50 micron.

12. The method of claim 11, wherein a material of the substrate is selected from nickel, copper or alloy thereof.

13. The method of claim 10, wherein a thickness of the first electric insulation layer is less than 20 microns.

14. The method of claim 10, wherein the electrodes are formed by following steps:

forming a first photoresist layer on the top surface of the LED chip;

etching opposite ends of the first photoresist layer to define two first through holes in the first photoresist layer to expose a part of the top surface of the LED chip;

forming a metallic film on a top surface of the first photoresist layer which fills in the first through holes; and removing the first photoresist layer and a part of the metallic film to remain the other part of the metallic film located in the first through hole to form the electrodes.

* * * * *